United States Patent
Huang et al.

(10) Patent No.: US 8,552,894 B2
(45) Date of Patent: Oct. 8, 2013

(54) SIGMA-DELTA MODULATOR HAVING A FEED-FORWARD PATH AND A HYBRID PORTION

(75) Inventors: Sheng-Jui Huang, Hsinchu (TW); Chen-Yen Ho, New Taipei (TW)

(73) Assignee: Mediatek Inc., Hsin-Chu (TW)

( * ) Notice: Subject to any disclaimer, the term of this patent is extended or adjusted under 35 U.S.C. 154(b) by 0 days.

(21) Appl. No.: 13/450,866

(22) Filed: Apr. 19, 2012

(65) Prior Publication Data

US 2012/0319881 A1 Dec. 20, 2012

Related U.S. Application Data

(60) Provisional application No. 61/497,435, filed on Jun. 15, 2011, provisional application No. 61/549,922, filed on Oct. 21, 2011.

(51) Int. Cl.
H03M 3/00 (2006.01)

(52) U.S. Cl.
USPC ........... 341/143; 341/144; 341/155; 375/302; 375/307; 375/296; 375/370

(58) Field of Classification Search
USPC ................. 341/143–155; 375/302, 307, 296, 375/370
See application file for complete search history.

(56) References Cited

U.S. PATENT DOCUMENTS

| | | | |
|---|---|---|---|
| 7,262,725 B2 * | 8/2007 | Huang et al. | 341/143 |
| 7,576,671 B2 * | 8/2009 | Petilli et al. | 341/143 |
| 7,675,448 B1 | 3/2010 | Huang et al. | |
| 7,786,913 B2 * | 8/2010 | Waheed et al. | 341/143 |
| 7,852,249 B2 * | 12/2010 | Oliaei | 341/143 |
| 7,880,654 B2 * | 2/2011 | Oliaei et al. | 341/143 |
| 7,944,385 B2 * | 5/2011 | Le Guillou | 341/143 |
| 7,956,780 B2 | 6/2011 | Doerrer | |
| 8,279,099 B2 * | 10/2012 | Zare-Hoseini | 341/143 |
| 8,294,605 B1 * | 10/2012 | Pagnanelli | 341/144 |
| 8,319,674 B2 * | 11/2012 | Loeda et al. | 341/143 |
| 2010/0283648 A1 | 11/2010 | Niwa et al. | |

OTHER PUBLICATIONS

Huang, S.J., et al.; "A 1.2V 2MHz BW 0.084mm2 CT Delta Sigma ADC with -97.7dBc THD and 80dB DR Using Low-Latency DEM;" ISSCC Data Converter Techniques; Session 9; 2009; pp. 172-174.
Shu, Y.S., et al.; "A 65 nm CMOS CT Delta Sigma Modulator with 81 dB DR and 8MHz BW Auto-Tuned by Pulse Injection;" ISSCC Delta Sigma Converters; Session 27; 2008; pp. 500-502.
Prefasi, E., et al.; "A 0.1 mm2, Wide Bandwidth Continuous-Time Sigma Delta ADC Based on a Time Encoding Quatizer in 0.13 um CMOS," IEEE Journal of Solid-State Circuits; vol. 44; No. 10; Oct. 2009; pp. 2745-2754.
Vadipour, M., et al.; "A 2.1m W/32m W Delay-Compensated GSM/CDMA Sigma Delta Analog-Digital Converter," Symposium on VLSI Circuits Digest of Technical Papers; 2008; pp. 180-181.

* cited by examiner

Primary Examiner — Lam T Mai
(74) Attorney, Agent, or Firm — McClure, Qualey & Rodack, LLP

(57) ABSTRACT

A sigma-delta modulator includes a front portion and a hybrid portion to form a loop filter. The front portion includes integrator(s) and feed-forward path(s), and is arranged to provide a front signal by combining signals of the integrator(s) and feed-forward path(s). The hybrid portion is coupled to the front portion, and arranged to provide a filtered signal by combining an integration of the front signal and a weighting of the front signal. The filtered signal is quantized, converted from digital to analog, and fed back to the loop filter.

20 Claims, 6 Drawing Sheets

SIGMA-DELTA MODULATOR HAVING A FEED-FORWARD PATH AND A HYBRID PORTION

This application claims the benefits of U.S. provisional patent application No. 61/497,435, filed Jun. 15, 2011, and U.S. provisional patent application No. 61/549,922, filed Oct. 21, 2011, the subject matters of which are incorporated herein by reference.

FIELD OF THE INVENTION

The present invention relates to a sigma-delta modulator, and more particularly, to a sigma-delta modulator including a resistive feed-forward loop filter arranged to achieve lower hardware complexity, decreased layout area and reduced power consumption by replacing a feed-forward path which directs to output of the loop filter.

BACKGROUND OF THE INVENTION

Sigma-delta modulator (SDM) for analog-to-digital converting is a key building block of modern signal/audio/video processing circuits and communication circuits.

SUMMARY OF THE INVENTION

A sigma-delta modulator includes a loop filter, a quantizer, and a digital-to-analog converter (DAC). An analog input signal is linearly combined with another analog feedback signal outputted by the DAC and fed to the loop filter. In response, the loop filter generated a filtered signal, which is then be quantized to a digital quantized signal by the quantizer. Thus, the analog input signal is converted to corresponding digital signal. The quantized signal is also converted back to a corresponding analog signal by the DAC, and then fed back to the loop filter as the feedback signal. Through the feed back architecture, quantization noise (error) is shaped to high frequency band and is filtered out by the loop filter.

Resistive feed-forward (FF) topology provides a solution to implement a high-performance continuous-time loop filter. The loop filter of resistive FF topology includes an integrator chain and several FF paths implemented by resistors. The integrator chain includes multiple serially coupled integrators for integrating signals; each integrator directs from one port to another port of an adjacent stepped-up order, that is, each integrator receives signal from one port, integrates the received signal and outputs to another port of an adjacent stepped-up order. Each of the FF paths is arranged to bypass the integrator chain, such that a signal of a lower-order port is weighted and fed forward to be added to a signal of a higher-order port. While the loop filter needs an FF path for a first signal of a lower-order port to be linearly combined with a second signal of a highest-order port (i.e., a signal outputted by the last integrator of the integrator chain), an additional summing circuit, such as an operational amplifier, is required to combine the first signal and the second signal. With the additional summing circuit, the loop filter consumes more power and occupies larger layout area.

For example, a 4-th order loop filter with an FF path to the highest-order port requires five operational amplifiers to be implemented; four of the five operational amplifiers implement four integrators for the order of four, and the rest one of the five operational amplifiers implements the additional summing circuit.

An embodiment of the invention provides a sigma-delta modulator including a front portion and a hybrid portion. The front portion includes at least a front integrators and at least a feed-forward (FF) path. The front integrator is arranged to provide a first integrated signal according to an integration of an internal signal. The feed-forward path, bypassing the front integrator, is arranged to provide a feed-forward signal by weighting the internal signal. The front portion is arranged to provide a summing signal in response to the first integrated signal, and to provide a front signal in response to a linear combination of the summing signal and the feed-forward signal. The hybrid portion is coupled to the front portion, and arranged to provide a weighted signal, a second integrated signal and a filtered signal respectively by weighting the front signal, integrating the front signal and combining the weighted signal and the second integrated signal.

In an embodiment, the hybrid portion includes a rear integrator for integrating the front signal and a resistive weighting path for weighting the front signal. As the hybrid portion integrates functionalities of integration and linear combination (weighting and summing), hardware complexity, power consumption and layout area of the loop filter is reduced. Therefore, a 4-th order loop filter can be implemented by four amplifiers; no extra amplifier is required for the additional summing circuit.

The front portion has a front input port for receiving an input signal and a front output port for outputting the front signal, and is further arranged to provide the internal signal in response to the input signal. The feed-forward path has a feed-forward input port for receiving the internal signal and a feed-forward output port for outputting the feed-forward signal. The front integrator has an integrator input port for receiving the internal signal and an integrator output port for outputting the first integrated signal. In an embodiment, the feed-forward input port is coupled to the integrator input port, and the feed-forward output port is coupled between the integrator output port and the front output port; that is, the FF path is coupled across the front integrator to bypass it.

In an embodiment, the front portion further includes a second front integrator coupled between the integrator output port and the front output port. Accordingly, the front portion is arranged to provide the summing signal in response to an integration of the first integrated signal.

In an embodiment, the second front integrator is coupled between the integrator output port and the feed-forward output port, and is arranged to provide a third integrated signal according to an integration of the first integrated signal. That is, the FF path is coupled across two or more front integrators. The front portion is further arranged to provide the summing signal in response to the third integrated signal. In an embodiment, the front portion can further include a second FF path coupled between the feed-forward input port and the integrator output port. That is, the second FF path is coupled across fewer front integrator(s) than the original FF path, and arranged to provide a second feed-forward signal by weighting the internal signal. Accordingly, the front portion is arranged to provide the summing signal in response to a linear combination of the first integrated signal and the second feed-forward signal.

In an embodiment, the second front integrator is coupled between the feed-forward output port and the front output port, and is arranged to provide a third integrated signal by integrating the combination of the feed-forward signal and the summing signal. That is, the FF path bypasses the first front integrator but is not coupled across the second front integrator. Accordingly, the front portion is further arranged to provide the front signal in response to the third integrated signal, e.g., an integration of the combination of the summing signal and the feed-forward signal.

In an embodiment, the signal-delta modulator further includes a quantizer and a digital-to-analog converter. The quantizer is coupled to the hybrid portion for providing a quantized signal by quantizing the filtered signal. The DAC is coupled to the quantizer for providing a feedback signal by converting the quantized signal. Accordingly, the front portion is further arranged to provide the internal signal in response to the feedback signal.

In an embodiment, the front portion is further arranged to provide a third internal signal in response to an auxiliary signal, and to provide a third integrated signal by integrating a combination of a second internal signal and the third internal signal. The front portion further includes an auxiliary path for providing the auxiliary signal by weighting the third integrated signal. In an embodiment, the front integrator is arranged to provide the first integrated signal by integrating a combination of the internal signal and the auxiliary signal, and the front portion is arranged to provide the third internal signal by weighting the first integrated signal. The second internal signal is provided by weighting the internal signal; for example, the feed-forward signal is provided as the second internal signal. The auxiliary path enhances filtration of in-band noise by introducing non-zero zeros in transfer function of the quantization noise.

An embodiment of the invention provides a sigma-delta modulator with a loop filter including an integration path, at least a feed-forward path and a hybrid potion. The integration path includes a plurality of orderly internal ports and a predetermined number (one or more) of front integrators, each front integrator is arranged to direct from one of the internal ports to another internal port of an adjacent stepped-up order. The feed-forward path is arranged to direct from one of the internal ports to another internal port of a higher order with the predetermined number of front integrators bypassed. The hybrid portion includes an input port coupled to one of the internal ports, an output port, a rear integrator for directing from the input port to the output port, and a weighting path for directing from the input port to the output port with the rear integrator bypassed.

In an embodiment, the sigma-delta modulator further includes a second feed-forward path for directing from one of the internal port to another internal port of a higher order. For example, assuming the original FF path directs from a first internal port to a second internal port, the second FF path can direct from the first internal port to a third internal port of a higher order than the first internal port.

In an embodiment, the sigma-delta modulator further includes an auxiliary path for directing from one of the internal ports to another internal port of a lower order. In an embodiment, assuming the auxiliary path directs to a first internal port, the integration path is further arranged to combine a signal directed to the first internal port by the auxiliary path and a signal directed to the first internal port by the integration path.

In an embodiment, the sigma-delta modulator also includes a quantizer and a DAC. The quantizer is coupled to the output port for quantizing a signal of the output port. The DAC is arranged to perform digital-to-analog conversion from the quantizer to one of the internal ports.

In an embodiment, assuming the FF path directs to a first internal port, then the integration path is further arranged to linearly combine a signal directed to the first internal port by the feed-forward path and a signal directed to the first internal port by the integration path.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1:
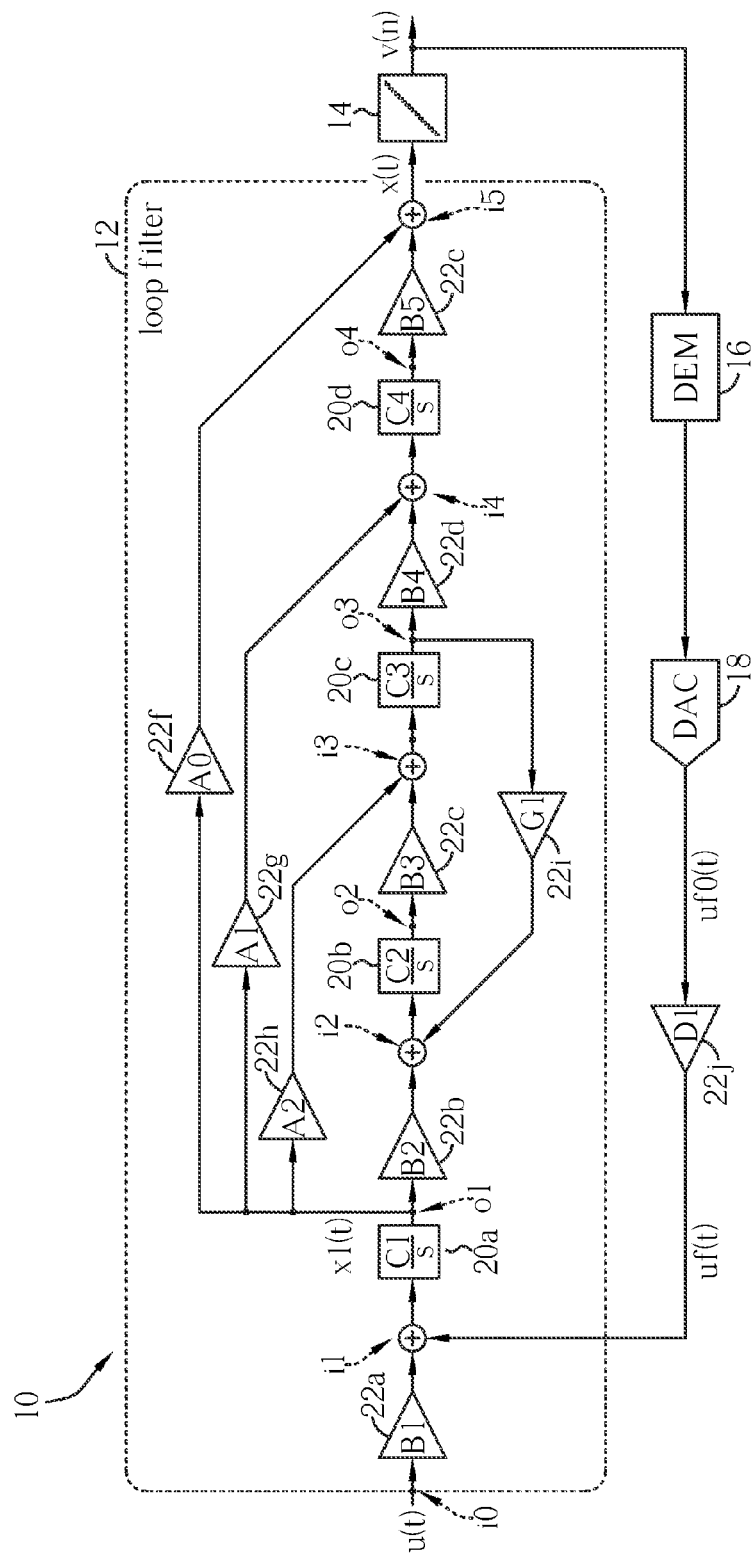
FIG. 1 illustrates an embodiment of an SDM including a loop filter.

Please refer to FIG. 1 illustrating an embodiment of a sigma-delta modulator 10. The sigma-delta modulator (SDM) 10 includes a loop filter 12, a quantizer 14, a dynamic element matching (DEM) circuit 16, and a DAC 18. The SDM 10 also includes a plurality of weighting circuits 22a to 22j, each weighting circuit is arranged to weight signal by a corresponding coefficient. When the SDM 10 converts an analog input signal u(t) to a corresponding digital signal v(n), the analog signal u(t) is received from a port i0, weighted by a coefficient B1, and added to another analog signal uf(t); the resultant sum is fed to the loop filter 12, and the loop filter 12 provides a filtered signal x(t) in response. The quantizer 14 then provides the digital quantized signal v(n) by quantizing the filtered signal x(t) of the loop filter. The DEM 16 and the DAC 18 cooperate to convert the digital quantized signal v(n) back to a corresponding analog signal uf0(t), which is then weighted by a coefficient D1 and fed back to the loop filter 12 as the signal uf(t).

In the SDM 10, the loop filter 12 is a fourth order filter of FF topology, and includes three FF paths and an integrator chain. The FF paths are respectively formed by weighting circuits 22f to 22h of coefficients A0 to A2. The integrator chain is formed by weighting circuits 22b to 22e of coefficients B2 to B5 and integrators 20a to 20d of transfer functions $C1/s$, $C2/s$, $C3/s$ and $C4/s$; where C1 to C4 are coefficients of the transfer functions. The integrators 20a to 20d are serially coupled with the weighting circuits 22b to 22e of the coefficients B2 to B5 located in-between. The integrator of 20a, directing from a port i1 to a port o1, provides (outputs) an integrated signal $x1(t)$ to the port o1 by integrating a signal received from the port i1. Similarly, the integrator 20b, 20c and 20d respectively direct from ports i2, i3 and i4 to ports o2, o3 and o4 for integration. The ports o1 and i3 to i5 imply orders (degrees) of integration; the port o1 is of a lowest order because there is only one integrator 20a between the ports i1 and o1. The port i3 is of an adjacent stepped-up order than the port o1 because there are two integrators 20a and 20b coupled between the ports i1 and i3. The port i4 is of an adjacent stepped-up order comparing to the port i3. Comparatively, the port i5 is of a highest order, since all the integrators of the loop filter 12 are coupled between the ports i1 and i5.

The weighting circuits 22f to 22h of the coefficients A0, A1 and A2 respectively implement three FF paths of the loop filter 12. Each FF path directs from a lower-order port to a higher-order port of the integrator chain, thus a signal of the lower-order port can be combined with a signal directed to the higher-order port through the integrator chain. For example, the FF path of the coefficient A2 directs from the port o1 to the port i3, such that the signal $x1(t)$ of the port o1 and the signal directed to the port i3 by the integrator chain can be linearly combined. Similarly, the FF path of the coefficient A0 directs from the port o1 to the highest-order port i5, so the signal $x1(t)$ of the port o1 can be linearly combined with the signal outputted by the last integrator 20d. From the port o1 to the port i5 along the integrator chain, the signal $x1(t)$ is integrated for third times by the integrators 20b to 20d, and is combined with the signal $x1(t)$ itself fed forward by the FF path of the coefficient A0.

Figure 2:
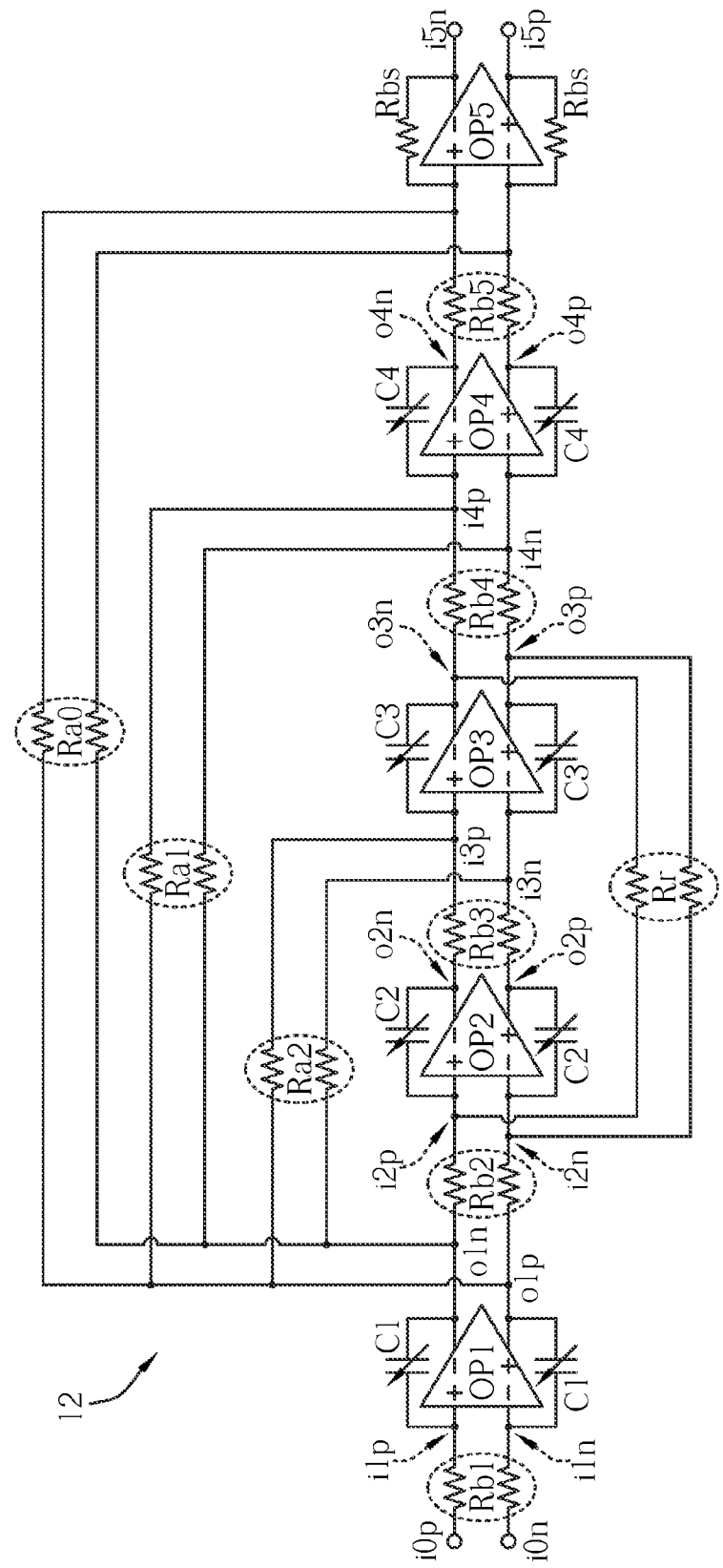
FIG. 2 illustrates an implementation example of the loop filter shown in FIG. 1.

Please refer to FIG. 2 illustrating an implementation embodiment of the loop filter 12. The integrators 20a to 20d are respectively implemented by differential amplifiers OP1 to OP4 and capacitors C1 to C4. The ports i0 to i5, o1 to o4 shown in FIG. 1 respectively correspond to pairs of nodes i0p/i0n to i5p/i5n, o1p/o1n to o4p/o4n. Pairs of resistors Rb1 to Rb5, Ra0 to Ra2, and Rr respectively relate to the coefficients B1 to B5, A0 to A2 and G1 shown in FIG. 1. It is noted that an additional differential amplifier OP5 and a pair of resistors Rbs are included, so the differential signal of the nodes o1p/o1n can be combined with the differential signal directed to the output nodes o4n/04p of the amplifier OP4. In other words, besides amplifiers respectively implementing integrators of the integrator chain, the loop filter topology shown in FIG. 1 requires an additional amplifier to sum the signals directed to the port i5 respectively by the integrator chain and the FF path of coefficient A0. The additional amplifier consumes additional power, and occupies additional layout area.

Figure 3:
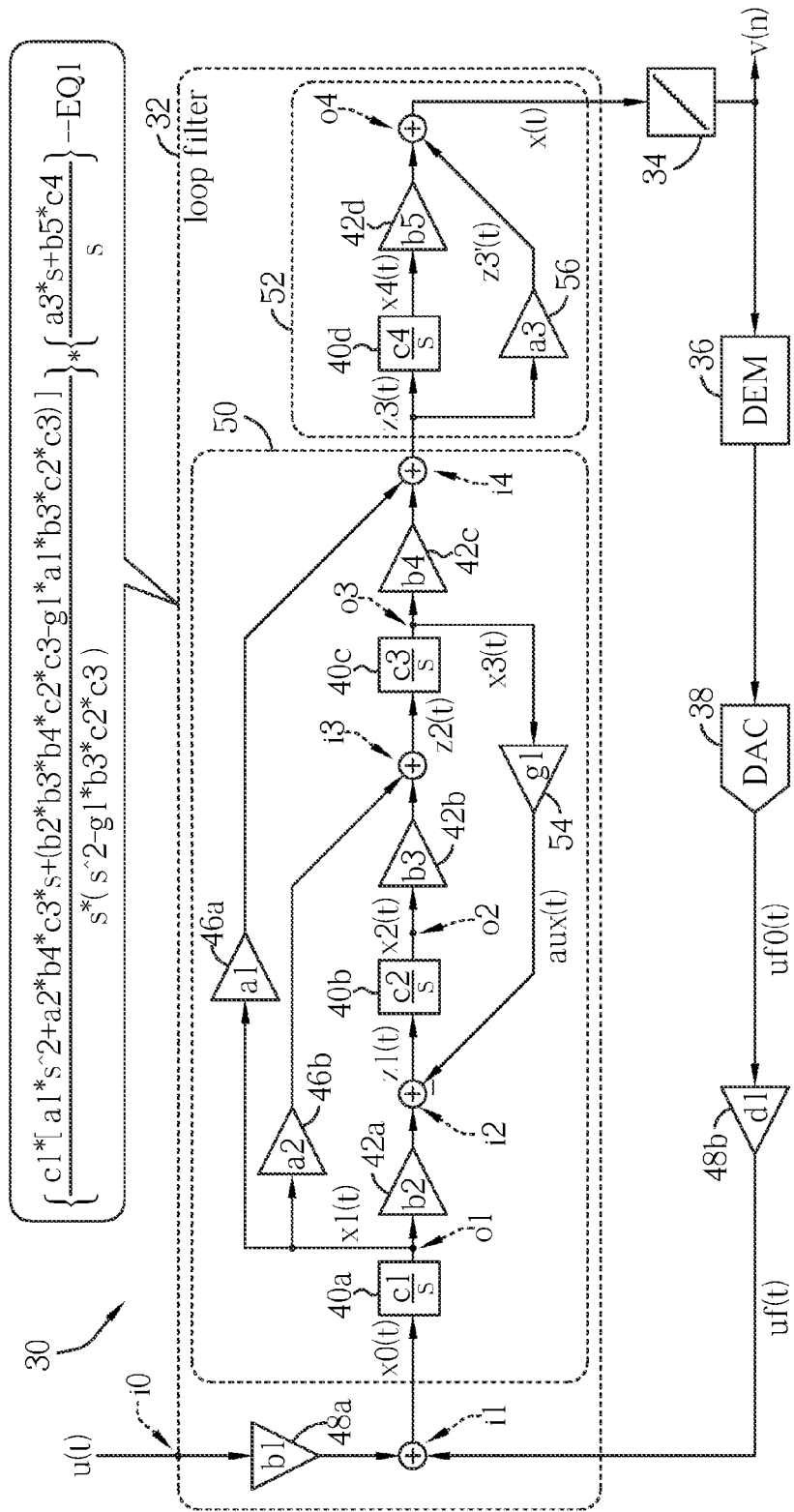
FIG. 3 illustrates an SDM including a loop filter according to an embodiment of the invention.

To address the issue of the additional amplifier, the invention provide a loop filter of a resistive FF topology, which adopts a weighting path between the highest-order port and a port of an adjacent stepped-down order, so the FF path from the lower-order port to the highest-order port can be replaced. Please refer to FIG. 3 illustrating an SDM 30 according to an embodiment of the invention. The SDM 30 functions as an analog-to-digital converter (ADC), and includes a loop filter 32, a quantizer 34, a DEM 36 and a DAC 38. As the SDM 30 converts an analog signal $u(t)$ to a corresponding digital signal $v(n)$, the analog input signal $u(t)$ to a port i0 is weighted by a weighting circuit 48a of a coefficient b1 and combined with an analog feedback signal $uf(t)$ to form a signal $x0(t)$. The loop filter 32 has two ports i1 and o4; through the port i1, the loop filter 32 receives the signal $x0(t)$ as an input signal, and provides a filtered signal $x(t)$ in response to the signal $x0(t)$. The filtered signal $x(t)$, outputted from the port o4, is transmitted to the quantizer 34. The quantizer 34 is coupled to the loop filter 32, and arranged to provide a digital quantized signal $v(n)$ by quantizing the filtered signal $x(t)$, thus the analog input signal $u(t)$ is converted to the quantized signal $v(n)$ by the SDM 30. The DAC 38 is coupled to the quantizer 34 through the DEM 36; with cooperation of the DEM 36, the DAC 38 is arranged to provide an analog feedback signal $uf0(t)$ by converting the quantized signal $v(n)$. The feedback signal $uf0(t)$ is weighted to the feedback signal $uf(t)$ by a weighting circuit 48b of a coefficient d1.

The loop filter 32, e.g., a 4-th order loop filter, includes a front portion 50 and a hybrid portion 52. The front portion 50 includes integrators 40a to 40c and weighting circuits 42a to 42c, 46a to 46b and 54. Respectively, the integrators 40a, 40b and 40c are of transfer functions $c1/s$, $c2/s$ and $c3/s$ with coefficients c1 to c3. The weighting circuits 42a to 42c, 46a to 46b and 54 are of respective coefficients b2 to b4, a1 to a2 and g1. The integrators 40a to 40c and the weighting circuits 42a to 42c are alternately coupled between ports i1, o1, i2, o2, i3, o3 and i4 to form a serial integration path. Due to the integrators 40b to 40c coupled between the ports o1, i3 and i4, the ports o1, i3 and i4 can be regarded as orderly internal ports of the integration path; the port o1 is of a lowest order and the port i4 is of a highest order. Each of the integrators 40a to 40c is arranged to direct from one internal port to another internal port of an adjacent stepped-up order. For example, the integrator 40b directs from the port i2 to the port i3, wherein the port i2 is regarded as another internal port of a same order as the port o1, since there is no integrator between the ports o1 and i2. Similarly, the ports o2 and i3 are of the same order. The integrators 40a to 40c provide integrated signals $x1(t)$, $x2(t)$ and $x3(t)$ to the ports o1, o2 and o3 by integrating the signal $x0(t)$, a signal $z1(t)$, and a signal $z2(t)$ received from the ports i1, i2 and i3, respectively.

In the loop filter 32, the weighting circuits 46a and 46b of the coefficients a1 and a2 form two FF paths. Each of the FF paths is arranged to direct from one internal port to another internal port of a higher order with the integrators 40a to 40c bypassed; a signal of a lower-order port can therefore be combined with a signal of a higher-order port. The FF path of the coefficient a1 directs from the port o1 to the port i4, then the signal $x1(t)$ outputted from the port o1 can be combined with the signal $x3(t)$ which is directed to the port i4 by the integration path. Similarly, the FF path of the coefficient a2 directs from the port o1 to another port i3, so the signal $x1(t)$ of the lower-order port o1 can be linearly combined with the signal $x2(t)$ of the higher-order port o2.

On the other hand, the weighting circuit 54 of the coefficient g1 forms an auxiliary path directing from the port o3 to the lower-order port i2. The signal $x3(t)$ is thus weighted by the coefficient g1 and added to the signal $b2*x1(t)$ at the port i2. That is, the integrator 40c of the front portion 50 provides the integrated signal $x3(t)$ by integrating a sum of the signals $a2*x1(t)$ and $b3*x2(t)$ respectively outputted by the weighted circuits 46b and 42b, the auxiliary path of the coefficient g1 provides an auxiliary signal $aux(t)$ by weighting the signal $x3(t)$, and the integrator 40b of the front portion 50 provides the signal $x2(t)$ by integrating the signal $z1(t)$ which is a linear combination of the auxiliary signal $aux(t)$ and the signal $x1(t)$ integrated by the integrator 40a, e.g., $z1(t)=(b2*x1(t)-g1*aux(t))$.

In the loop filter 32, the hybrid portion 52 is coupled to the port i4, and includes an integrator 40d and two weighting circuits 42d and 56. The integrator 40d is of a transfer function $c4/s$ with a coefficient c4, and the weighting circuits 42d and 56 are of coefficients b5 and a3, respectively. The integrator 40d directs from the port i4 to the port o4, and provides an integrated signal $x4(t)$ by integrating a signal $z3(t)$ outputted by the front portion 50. The weighting circuits 56 of the coefficient a3 forms a weighting path directing from the port i4 to the port o4, and provides a weighted signal $z3'(t)$ by weighting the signal $z3(t)$, and the signal $x(t)$ is a linear combination of the signals $x4(t)$ and $z3'(t)$. An equation EQ1 shown in FIG. 3 demonstrates the Laplace-domain transfer function of the loop filter 32, e.g., $X(s)/X0(s)$ with $X(s)$ and $X0(s)$ respectively being the Laplace transforms of the time-domain signal $x(t)$ and $x0(t)$. In the equation EQ1, the front portion 50 contributes a 3rd-order transfer function of three poles and two zeros; the hybrid portion 52 contributes a transfer function of a pole and a zero.

Because the signal $z1(t)$ includes the signal $x1(t)$ with $z1(t)=(b2*x1(t)-g1*x3(t))$, when the integrator 40b provides the signal $x2(t)$ to the port i3 by integrating the signal $z1(t)$, the integrated signal $x2(t)$ includes the signal $x1(t)$; in other words, through the FF path of the coefficient a2 and the integrator 40b, the signal $x1(t)$ itself and its integration is combined at the port i3. Furthermore, since the signal $z2(t)$ to be integrated by the integrator 40c includes weighted integration of the signal $x1(t)$, the signal $x1(t)$ is twice integrated by the integrators 40b and 40c along the integration path, and the resultant two-time integration is also combined with the signal $x1(t)$ itself through the FF path of the coefficient a1. In the hybrid portion 52, the signal $x1(t)$ further experiences a third-time integration of the integrator 40d. That is, by the integrators 40b to 40d, the signal $x1(t)$ is integrated for three times to become a portion of the signal $x4(t)$.

In the FF topology shown in FIG. 1, the FF path of the coefficient A0 allows the signal $x1(t)$ to be combined with the three-time integrated result of the signal $x1(t)$ itself, but also requires the additional amplifier OP5 to implement the combination. Instead, the loop filter 32 shown in FIG. 3 replaces the FF path of the coefficient A0 with the weighting path of the coefficient a3. Through the paths of the weighting circuits 46a and 56, the signal $x1(t)$ is fed forward to the port o4, so the signal $x1(t)$ is also allowed to be combined with the three-time integrated result of the signal $x1(t)$. Hence, the loop filter 32 provides sufficient functionalities comparable to the loop filter 12. However, the hybrid portion 52 can be implemented with a single amplifier; hardware complexity, power consumption and layout area of the loop filter 32 is therefore reduced comparing to the loop filter 12.

Figure 4:
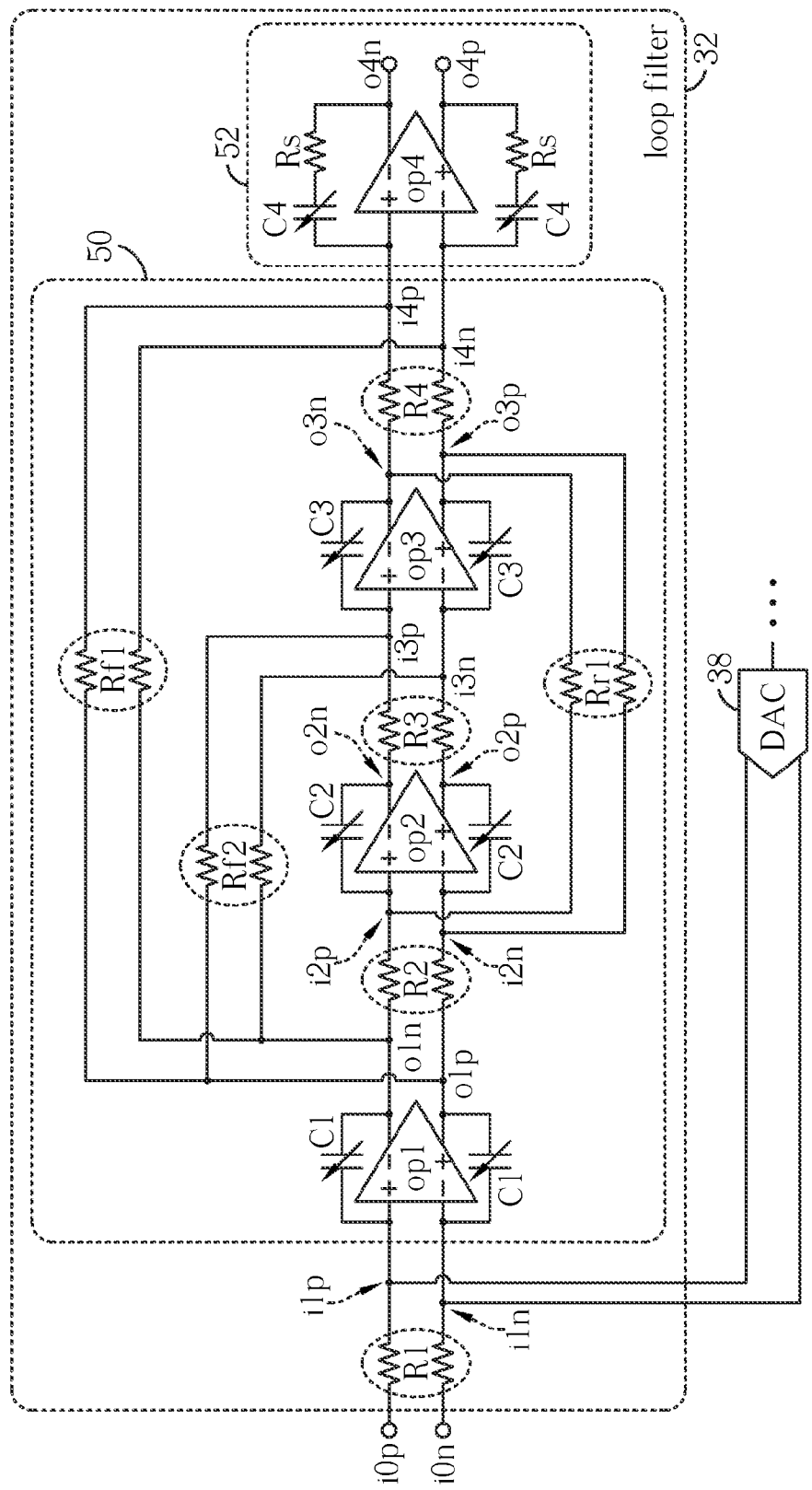
FIG. 4 illustrates an implementation example of the loop filter shown in FIG. 3 according to an embodiment of the invention.

Please refer to FIG. 4 illustrating a circuit level implement example of the loop filter 32 according to an embodiment of the invention. In FIG. 4, the loop filter 32 shown in FIG. 3 is implements by four amplifiers (e.g., differential operational amplifiers) op1 to op4, pairs of resistors R1 to R4, Rf1 to Rf2, Rr1 and Rs, as well as pairs of capacitors C1 to C4 (e.g., variable capacitors). Pairs of differential nodes i0p and i0n, i1p and i1n, i2p and i2n, i3p and i3n, i4p and i4n, o1p and o1n, o2p and o2n, o3p and o3n, as well as o4p and o4n respectively correspond to the ports i0, i1, i2, i3, i4, o1, o2, o3 as well as o4. The integrators 40a to 40d (FIG. 3) are respectively implemented by the amplifiers op1 to op4 and the pairs of capacitors C1 to C4. For example, the nodes i1p, i1n, o1p and o1n are respectively coupled to a positive input, a negative input, a positive output and a negative output of the amplifier op1; one of the capacitors C1 is coupled between the positive input and the negative output of the amplifier op1, and the other one of the capacitors C1 is coupled between the negative input and the positive output of the amplifier op1.

The pairs of resistors R1 are respectively coupled to the positive input and the negative input of the amplifiers opt. One resistor of the resistor pair R2/R3/R4/Rr1 is coupled between the positive output of the amplifier op1/op2/op3/op3 and the negative input of the amplifier op2/op3/op4/op2, and the other resistor of the resistor pair R2/R3/R4/Rr1 is coupled between the negative output of the amplifier op1/op2/op3/op3 and the positive input of the amplifier op2/op3/op4/op2. One resistor of the resistor pair Rf1/Rf2 is coupled between the positive output of the amplifier op1 and the positive input of the amplifier op4/op3, and the other resistor of the resistor pair Rf1/Rf2 is coupled between the negative output of the amplifier op1 and the negative input of the amplifier op4/op3. One of the resistor pair Rs and one of the capacitor pair C4 are serially coupled between the positive output and the negative input of the amplifier op4, and the other of the resistor pair Rs and the other of the capacitor pair C4 are serially coupled between the negative output and the positive input of the amplifier op4.

Values of the coefficients c1 to c4 (FIG. 3) can be determined by capacitance of the capacitors C1 to C4. Resistance of pairs of resistors R1, R2, R3, R4, Rf1, Rf2, Rs and Rr1 respectively corresponds to values of the coefficients b1, b2, b3, b4, al, a2, a3 and g1, wherein the coefficient b5 can be merged to the coefficient c4, so a product of the coefficients c4*b5 is controlled by capacitance of the capacitor C4. As shown in FIG. 4, the hybrid portion 52, which provides multiple functions of integration and linear combination (weighting and summing), can be implemented by the single amplifier op4, the resistors Rs and the capacitors C4.

Comparing FIG. 4 with FIG. 2, it is recognized that, by replacing the FF path of the coefficient A0 (FIG. 1), number of the amplifiers required to implement the transfer function of the same order is reduced from five (FIG. 2) to four (FIG. 4). Functions of summation and integration, originally implemented by two respective amplifiers OP5 and OP4 in FIG. 2, are merged to be implemented by a single amplifier op4 in the hybrid portion 52, as shown in FIG. 4.

Figure 5:
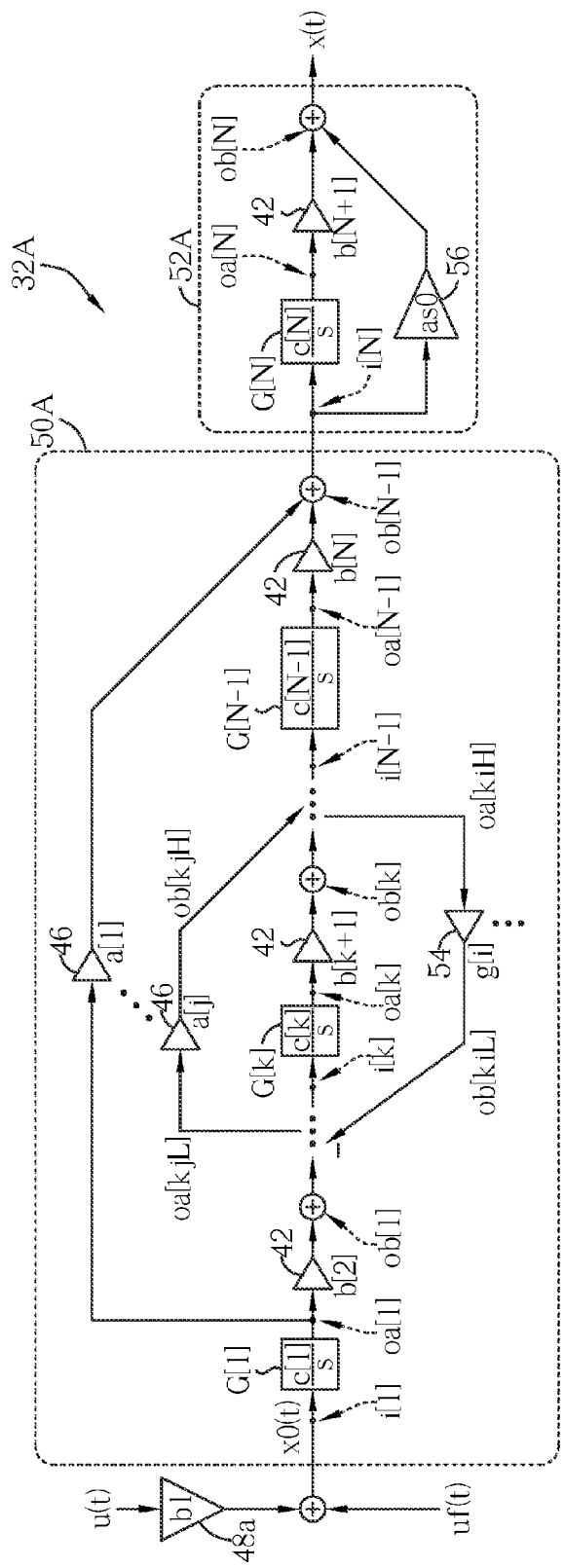
FIG. 5 illustrates an SDM including a loop filter according to an embodiment of the invention.

Please refer to FIG. 5 illustrating a generalized loop filter 32A according to an embodiment of the invention; the loop filter 32A can be adopted to replace the loop filter 32 in the SDM 30 (FIG. 3). The loop filter 32A includes a number N of integrators G[1] to G[N], the number N of weighting circuits 42, a weighting circuit 56, and one or more weighting circuits 46 to form a front portion 50A and a hybrid portion 52A. In addition, the loop filter 32A can include none, one or more weighting circuits 54 in the front portion 50A.

The integrators G[1] to G[N] are of respective transfer functions $c[1]/s$ to $c[N]/s$; each integrator G[k] of transfer function $c[k]/s$ is coupled between a port i[k] and a port oa[k], and arranged to integrate a signal received from the port i[k] and accordingly outputs integration result to the port oa[k], for k=1 to N. The weighting circuits 42 are of respective coefficients b[2] to b[N]; for k=1 to (N−1), each weighting circuit 42 of the coefficient b[k+1] is coupled between the port oa[k] and a port ob[k], hence signal of the port ob[k] is weighted by the coefficient b[k+1] and transmitted to the port ob[k]. For k=1 to (N−1), each of the port ob[k] is coupled to the port i[k+1] of next integrator, thus the integrators G[1] to G[N−1] and the weighting circuits 42 of coefficients b[2] to b[N] are serially coupled in an alternating fashion to form a integration path in the front portion 50A.

Each weighting circuit 46 is arranged to provides a coefficient a[j], and to form an FF path directing from ports oa[kjL] to ob[kjH], such that a signal of the port oa[kjL] is weighted by the coefficient a[j] and outputted to the port ob[kjH], wherein the indices kjH and kjL are selected from 1 to (N−1), and the index kjH is greater than the index kjL. For example, a weighting circuit 46 of a coefficient a[1] directing from the port oa[1] to the port ob[N−1] can be included in the front portion 50A. In an embodiment, there are (N−2) FF paths of coefficients a[1] to a[N−2]; for j=1 to (N−2), each coefficient a[j] directs from the port oa[1] to the port ob[N-j] and thus bypasses the integrators G[1] to G[N−1]. As the FF path of the coefficient a[j] is coupled across the ports oa[kjL] and ob[kjH], the integrators coupled between the ports oa[kjL] and ob[kjH] are bypassed, and thus the signal of the port oa[kjL] is allowed to combine with the signal which is directed from the port oa[kjH] to the port ob[kjH] along the integration path. In other words, along an FF path, a signal experiencing fewer-time integration (e.g., signal of the port oa[kjL]) can be directly combined with a signal experiencing more-time integration (e.g., signal of the port ob[kjH]) through the integration path.

Each weighting circuit 54, if included, is arranged to provides a coefficient g[i], and to form an auxiliary path directing from the ports oa[kiH] to ob[kiL], such that a signal of the port oa[kiH] is weighted by the coefficient g[i] and sent to the port ob[kiL]; wherein the indices kjH and kiL are selected from 1 to (N−1), and the index kiH is greater than the index kiL. For example, a weighting circuit 54 of a coefficient g1 (not shown) directing from the port oa[3] to the port ob[1] can be included in the front portion 50A. In the front portion 50A, each of the ports ob[k], for k=1 to (N−1), allows a signal from an FF path or auxiliary path to be added to a signal of the integration path. If no FF paths or auxiliary paths direct to a port ob[k] of the ports ob[1] to ob[N−1], the port ob[k] is merged with the port i[k+1]. The auxiliary paths help to control poles of the transfer function of the loop filter 32A (i.e., zeros of quantization noise), such that some of the poles can be placed to higher frequency rather than zero.

In the hybrid portion 52A, the integrator G[N] of the transfer function c[N]/s and the weighting circuit 42 of the coefficient b[N+1] direct from the port i[N] to the port ob[N]. The weighting circuit 56 of coefficient as0 forms a weighting path directing from the port i[N] to the port ob[N] and bypassing the integrator G[N]. For k less than N, if a first signal of the port oa[k] is desired to be combined with a second signal integrated by the last integrator G[N], the first signal from the port oa[k] is directed to the port ob[N−1] by an FF path extending only in the front portion 50A, so the first signal can then be directed to the port ob[N] through the weighting circuit 56 in the hybrid portion 52A, and be combined with the second signal outputted by the integrator G[N].

Figure 6:
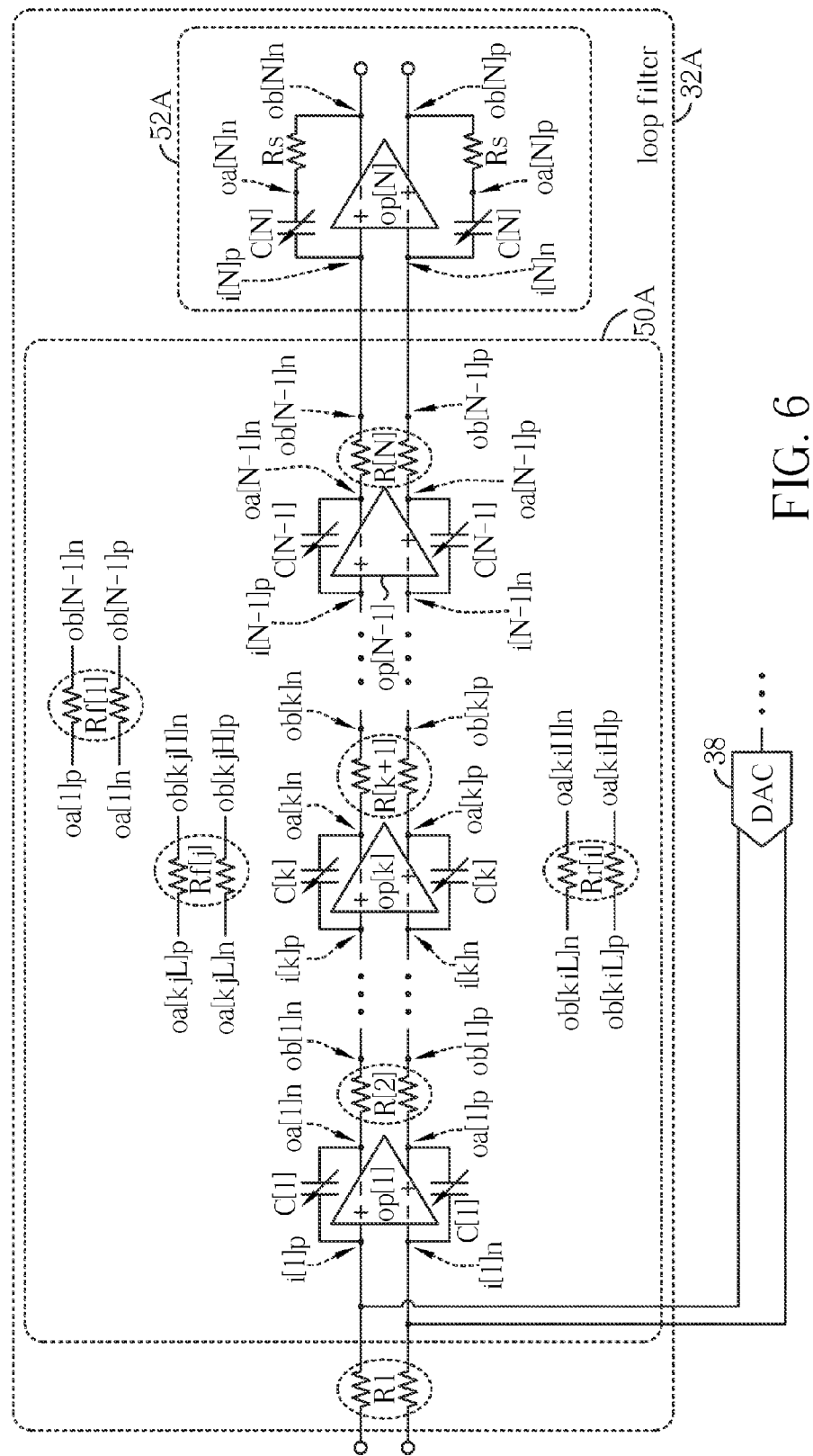
FIG. 6 illustrates an implementation example of the loop filter shown in FIG. 5 according to an embodiment of the invention.

With the integrators G[1] to G[N] and the FF path(s), the loop filter 32A provides N-th order transform function of N poles. The front portion 50A provides a transfer function of (N−1)-th order to be multiplied by a transfer function of the hybrid portion 52A. Because the hybrid portion 52A, similar to the hybrid portion 52 in FIG. 3, can be implemented by a single amplifier, the loop filter 32A can be implemented by only N amplifiers, instead of (N+1). Please refer to FIG. 6 illustrating an implementation example of the loop filter 32A according to an embodiment of the invention. In the front portion 50A, the integration path shown in FIG. 5 can be implemented by amplifiers op[1] to op[N−1], pairs of capacitors C[1] to C[N−1] and pairs of resistors R[2] to R[N]; each FF path of the coefficient a[j] can be implemented by a pair of resistors Rf[i], and each auxiliary path of the coefficient g[i] can be implemented by a pair of resistors Rr[i]. The hybrid portion 52A can be implemented by a pair of capacitors C[N], a pair of resistors Rs and an amplifier op[N]. For k=1 to N, the ports i[k], oa[k] and ob[k] shown in FIG. 5 respectively correspond to pairs of differential nodes i[k]p and i[k]n, oa[k]p and oa[k]n, ob[k]p and ob[k]n. The nodes i[k]p and i[k]n are respectively coupled to the nodes ob[k−1]n and ob[k−1]p, for k=2 to N.

For k=1 to (N−1), a positive input, a negative input, a positive output and a negative output of the amplifier G[k] are respectively coupled to the node i[k]p, i[k]n, oa[k]p and oa[k]n; one of the capacitors C[k] is coupled between the nodes i[k]p and oa[k]n, the other one of the capacitors C[k] is coupled between the nodes i[k]n and oa[k]p; one of the resistors R[k+1] is coupled between the nodes oa[k]p and ob[k]p, and the other one of the resistors R[k+1] is coupled between the nodes oa[k]n and ob[k]n. In the hybrid portion 52A, one of the capacitors C[N] and one of the resistors Rs are coupled between the nodes i[N]p and ob[N]n, the other one of the capacitors C[N] and the other one of the resistors Rs are coupled between the nodes i[N]n and ob[N]p.

For each FF path, one of the resistors Rf[j] is coupled between the nodes oa[kjL]p and ob[kjH]n, the other is coupled between the nodes oa[kjL]n and ob[kjH]p. For example, to implement the coefficient a[1] in FIG. 5, a resistor Rf[1] is coupled between the nodes oa[1]p and ob[N−1]n, and another resistor Rf[1] is coupled between the nodes oa[1]n and ob[N−1]p. For the auxiliary path, one of the resistors Rr[i] is coupled between the nodes oa[kiH]n and ob[kiL]n, the other is coupled between the nodes oa[kiH]p and ob[kjL]p.

While the SDM 30 shown in FIG. 3 adopts a continuous-time loop filter 32, the SDM 30 in general can also be a hybrid type SDM combining continuous-time and discrete-time signal processing. The DAC 38 (shown in FIG. 3, FIG. 4 and FIG. 6), in cooperation with the DEM 36 (FIG. 3), converts the digitized signal v(n) back to the analog signal uf0(t) for feedback. While the SDM 30 shown in FIG. 3 adopts a single DAC to feedback an analog signal back to the loop filter, the SDM 30 can include multiple DACs for feedback. For example, referring to FIG. 3, an additional DAC, as well as a cooperative DEM if necessary (both not shown), can be arranged between the quantizer 34 and the port i2 or i3, so an analog signal converted from the signal v(n) can be fed back to the port i2 of the integrator 20b or the port i3 of the integrator 20c.

To sum up, the invention provides an improved resistive FF topology for a loop filter in a continuous-time SDM. In the loop filter of resistive FF topology, N integrators G[1] to G[N] are orderly coupled in a serial sequence, and the last integrator G[N] is equipped with a weighting path to form a multi-function hybrid portion capable of performing integration and linear combination; while a first signal outputted by an integrator G[k] is demanded to combine with a second signal outputted by the integrator G[N] with k<N, the first signal is fed forward to the weighting path, such that the first signal can be combined with the second signal. With each of the integrators G[1] to G[N−1] and the hybrid portion including the integrator G[N] can be respectively implemented by a single amplifier, a total number N of amplifiers, instead of (N+1), are needed. Accordingly, hardware complexity, power consumption, layout area of the loop filter and the SDM are effectively reduced. In an embodiment, the SDM of the invention is applied to a baseband demodulator in cooperation with an RF tuner. The RF tuner receives an RF signal and down-converts it to I-part and Q-part signals of in-phase and quadrature phase. In the baseband demodulator, the I-part signal and the Q-part signal are then respectively digitized by two sigma-delta modulators of the invention.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:
1. A sigma-delta modulator comprising:
   a front portion comprising:
      a front integrator arranged to provide a first integrated signal according to an integration of an internal signal;
      a feed-forward path arranged to provide a feed-forward signal by weighting the internal signal, wherein the front portion is arranged to provide a summing signal in response to the first integrated signal, and to provide a front signal in response to a combination of the summing signal and the feed-forward signal; and a hybrid portion coupled to the front portion, and arranged to provide a weighted signal, a second integrated signal and a filtered signal respectively by weighting the front signal, integrating the front signal and combining the weighted signal and the second integrated signal.

2. The sigma-delta modulator as claimed in claim 1, wherein the front portion further comprises a front input port for receiving an input signal and a front output port for outputting the front signal, and is further arranged to provide the internal signal in response to the input signal; the feed-forward path comprises a feed-forward input port for receiving the internal signal and a feed-forward output port for outputting the feed-forward signal, the front integrator comprises an integrator input port for receiving the internal signal and an integrator output port for outputting the first integrated signal; wherein the feed-forward input port is coupled to the integrator input port, and the feed-forward output port is coupled between the integrator output port and the front output port.

3. The sigma-delta modulator as claimed in claim 2, wherein the front portion further comprises a second front integrator coupled between the integrator output port and the front output port.

4. The sigma-delta modulator as claimed in claim 3, wherein the second front integrator is coupled between the integrator output port and the feed-forward output port, and is arranged to provide a third integrated signal according to an integration of the first integrated signal; wherein the front portion is further arranged to provide the summing signal in response to the third integrated signal.

5. The sigma-delta modulator as claimed in claim 4, wherein the front portion further comprises a second feed-forward path coupled between the feed-forward input port and the integrator output port, and arranged to provide a second feed-forward signal by weighting the internal signal; wherein the front portion is arranged to provide the summing signal in response to a combination of the first integrated signal and the second feed-forward signal.

6. The sigma-delta modulator as claimed in claim 3, wherein the second front integrator is coupled between the feed-forward output port and the front output port, and is arranged to provide a third integrated signal by integrating the combination of the feed-forward signal and the summing signal; wherein the front portion is further arranged to provide the front signal in response to the third integrated signal.

7. The sigma-delta modulator as claimed in claim 1 further comprising:
a quantizer coupled to the hybrid portion for providing a quantized signal by quantizing the filtered signal; and
a digital-to-analog converter (DAC) coupled to the quantizer for providing a feedback signal by converting the quantized signal;
wherein the front portion is further arranged to provide the internal signal in response to the feedback signal.

8. The sigma-delta modulator as claimed in claim 1, wherein the front portion is arranged to provide the summing signal in response to an integration of the first integrated signal.

9. The sigma-delta modulator as claimed in claim 1, wherein the front portion is arranged to provide the front signal in response to an integration of the combination of the summing signal and the feed-forward signal.

10. The sigma-delta modulator as claimed in claim 1, wherein the front portion is further arranged to provide a third integrated signal by integrating a combination of a second internal signal and a third internal signal; wherein the front portion further comprises an auxiliary path for providing an auxiliary signal by weighting the third integrated signal, and the front portion is further arranged to provide the third internal signal in response to the auxiliary signal.

11. The sigma-delta modulator as claimed in claim 10, wherein the front integrator is arranged to provide the first integrated signal by integrating a combination of the internal signal and the auxiliary signal, and the front portion is arranged to provide the third internal signal by weighting the first integrated signal.

12. The sigma-delta modulator as claimed in claim 11, wherein the second internal signal is the feed-forward signal.

13. The sigma-delta modulator as claimed in claim 1, wherein the hybrid portion comprises:
a rear integrator for integrating the front signal; and
a weighting path for weighting the front signal.

14. A sigma-delta modulator comprising:
an integration path comprising a plurality of orderly internal ports and a predetermined number of front integrators, each front integrator arranged to direct from one of the internal ports to another internal port of an adjacent stepped-up order;
a feed-forward path for directing from one of the internal ports to another internal port of a higher order with the predetermined number of front integrators bypassed; and
a hybrid portion comprising an input port coupled to one of the internal ports, an output port, a rear integrator for directing from the input port to the output port, and a weighting path for directing from the input port to the output port with the rear integrator bypassed.

15. The sigma-delta modulator as claimed in claim 14 further comprises:
a second feed-forward path for directing from one of the internal port to another internal port of a higher order.

16. The sigma-delta modulator as claimed in claim 14, wherein the feed-forward path directs from a first internal port of the internal ports to a second internal port of the internal ports, and the sigma-delta modulator further comprises:
a second feed-forward path for directing from the first internal port to a third internal port of the internal ports, wherein the third internal port is of a higher order than the first internal port.

17. The sigma-delta modulator as claimed in claim 14 further comprising
an auxiliary path for directing from one of the internal ports to another internal port of a lower order.

18. The sigma-delta modulator as claimed in claim 17, wherein the auxiliary path directs to a first internal port of the internal port, and the integration path is arranged to combine a signal directed to the first internal port by the auxiliary path and a signal directed to the first internal port by the integration path.

19. The sigma-delta modulator as claimed in claim 14 further comprising:
a quantizer coupled to the output port for quantizing a signal of the output port; and
a digital-to-analog converter (DAC) for performing digital-to-analog conversion from the quantizer to one of the internal ports.

20. The sigma-delta modulator as claimed in claim 14, wherein the feed-forward path directs to a first internal port of the internal port, and the integration path is arranged to combine a signal directed to the first internal port by the feedforward path and a signal directed to the first internal port by the integration path.

* * * * *